(12) United States Patent
Hatori et al.

(10) Patent No.: US 9,235,000 B2
(45) Date of Patent: Jan. 12, 2016

(54) OPTICAL SEMICONDUCTOR APPARATUS

(71) Applicants: FUJITSU LIMITED, Kawasaki-shi, Kanagawa (JP); NEC Corporation, Minato-ku, Tokyo (JP)

(72) Inventors: Nobuaki Hatori, Tsukuba (JP); Masashige Ishizaka, Tokyo (JP); Takanori Shimizu, Tokyo (JP)

(73) Assignees: FUJITSU LIMITED, Kawasaki (JP); NEC CORPORATION, Toyko (JP)

( * ) Notice: Subject to any disclaimer, the term of this patent is extended or adjusted under 35 U.S.C. 154(b) by 146 days.

(21) Appl. No.: 14/205,600

(22) Filed: Mar. 12, 2014

(65) Prior Publication Data

US 2014/0314370 A1    Oct. 23, 2014

(30) Foreign Application Priority Data

Apr. 17, 2013   (JP) .................................. 2013-086524

(51) Int. Cl.
| | |
|---|---|
| *G02B 6/12* | (2006.01) |
| *H01S 5/06* | (2006.01) |
| *G02B 6/42* | (2006.01) |
| *H01S 5/00* | (2006.01) |
| *H01S 5/068* | (2006.01) |
| *H01L 29/12* | (2006.01) |

(52) U.S. Cl.
CPC .. *G02B 6/12* (2013.01); *G02B 6/42* (2013.01); *G02B 6/4266* (2013.01); *H01S 5/005* (2013.01); *H01S 5/068* (2013.01); *G02B 6/4202* (2013.01); *G02B 6/4224* (2013.01); *G02B 6/4238* (2013.01); *G02B 2006/12038* (2013.01); *G02B 2006/12061* (2013.01); *G02B 2006/12107* (2013.01); *G02B 2006/12121* (2013.01); *G02B 2006/12128* (2013.01); *G02B 2006/12147* (2013.01); *H01L 29/127* (2013.01)

(58) Field of Classification Search
None
See application file for complete search history.

(56) References Cited

U.S. PATENT DOCUMENTS

| | | | |
|---|---|---|---|
| 5,497,389 A | | 3/1996 | Kasukawa et al. |
| 7,792,429 B2 * | | 9/2010 | Park .................... H04J 14/0226 398/135 |
| 2002/0114593 A1 | | 8/2002 | Terada et al. |
| 2003/0039043 A1 * | | 2/2003 | Nekado .............. G02B 6/12004 359/896 |
| 2004/0121520 A1 * | | 6/2004 | Karkkainen ........... G02B 6/423 438/107 |

(Continued)

FOREIGN PATENT DOCUMENTS

| | | |
|---|---|---|
| JP | 7-74427 | 3/1995 |
| JP | 2002-182076 | 6/2002 |
| JP | 2011-3803 | 1/2011 |

OTHER PUBLICATIONS

Patent Abstracts of Japan, Publication No. 2002-182076, Published Jun. 26, 2002.
Patent Abstracts of Japan, Publication No. 7-4427, Published Mar. 17, 1995.

(Continued)

*Primary Examiner* — Michelle R Connelly
(74) *Attorney, Agent, or Firm* — Staas & Halsey LLP

(57) ABSTRACT

An optical semiconductor device includes a silicon oxide layer configured to be formed on a substrate; an optical waveguide part configured to be formed on the silicon oxide layer; a cladding layer configured to be formed covering the optical waveguide part; and a semiconductor laser configured to be disposed on the substrate. Laser light emitted from the semiconductor laser enters the optical waveguide part. The optical waveguide part increases transmittance of light when the wavelength becomes greater within an oscillation wavelength range of the semiconductor laser.

12 Claims, 7 Drawing Sheets

(56) References Cited

U.S. PATENT DOCUMENTS

| | | | |
|---|---|---|---|
| 2008/0199128 A1* | 8/2008 | Tanaka | G02B 6/2821 385/14 |
| 2011/0085760 A1* | 4/2011 | Han | G02B 6/423 385/14 |
| 2014/0293402 A1* | 10/2014 | Ide | G02B 6/125 359/326 |

OTHER PUBLICATIONS

Patent Abstracts of Japan, Publication No. 2011-3803, Published Jan. 6, 2011.

Y. Tanaka et al. "25 Gbps Direct Modulation in 1.3-micrometer InAs/GaAs, High-Density Quantum Dot Lasers," IEEE, CLEO, CTuZ1, San Jose, USA (2010).

* cited by examiner

OPTICAL SEMICONDUCTOR APPARATUS

CROSS-REFERENCE TO RELATED APPLICATIONS

This application is based upon and claims the benefit of priority of the prior Japanese Priority Application No. 2013-086524 filed on Apr. 17, 2013, the entire contents of which are hereby incorporated by reference.

FIELD

The disclosures herein generally relate to an optical semiconductor device.

BACKGROUND

A semiconductor laser is used as a light source for optical communication and data processing in optical fiber communication, optical interconnect, and the like. In general, a semiconductor laser has fluctuation in emitted optical output and wavelength depending on environmental temperature, for example, emitted optical output becomes less when temperatures go higher. To cope with such temperature fluctuations of a semiconductor laser, there are methods with which a stable characteristic can be obtained even when the environmental temperature changes which include a method of adjusting temperature using a TEC (thermoelectric cooler), and a method using an APC (Automatic Power Control) circuit. Also, as a method other than the above, a semiconductor laser is disclosed that uses a reflection mirror having wavelength dependency to make a stable level of emitted optical output in response to wavelength shifts due to environmental temperature changes.

RELATED-ART DOCUMENTS

Patent Documents

[Patent Document 1] Japanese Laid-open Patent Publication No. 2002-182076
[Patent Document 2] Japanese Laid-open Patent Publication No. 07-74427
[Patent Document 3] Japanese Laid-open Patent Publication No. 2011-3803

Non-Patent Document

[Non-Patent Document 1] Y. Tanaka, M. Ishida, K. Takada, T. Yamamoto, H.-Z. Song, Y. Nakata, M. Yamaguchi, K. Nishi, M. Sugawara, Y. Arakawa, CLEO, CTuZ1, San Jose, USA (2010)

However, if using such a TEC or an APC, the TEC or APC needs to be installed, which leads to a higher cost, increased power consumption, and a greater size of the optical semiconductor device, which is not preferable. Also, if using a semiconductor laser using a reflection mirror having wavelength dependency, fluctuations of optical output depending on temperature change cannot be sufficiently suppressed to contain the optical output fluctuations within a desired range.

Therefore, as an optical semiconductor device that emits laser light, an optical semiconductor device with a low cost has been desired which has extremely small optical output fluctuations for temperature changes.

SUMMARY

According to at least one embodiment of the present invention, an optical semiconductor device includes a silicon oxide layer configured to be formed on a substrate; an optical waveguide part configured to be formed on the silicon oxide layer; a cladding layer configured to be formed covering the optical waveguide part; and a semiconductor laser configured to be disposed on the substrate. Laser light emitted from the semiconductor laser enters the optical waveguide part. The optical waveguide part increases transmittance of light when the wavelength becomes greater within an oscillation wavelength range of the semiconductor laser.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

In the following, embodiments of the present invention will be described with reference to the drawings. The same elements and the like are assigned the same numerical codes, and their description is omitted.

Figure 1A:
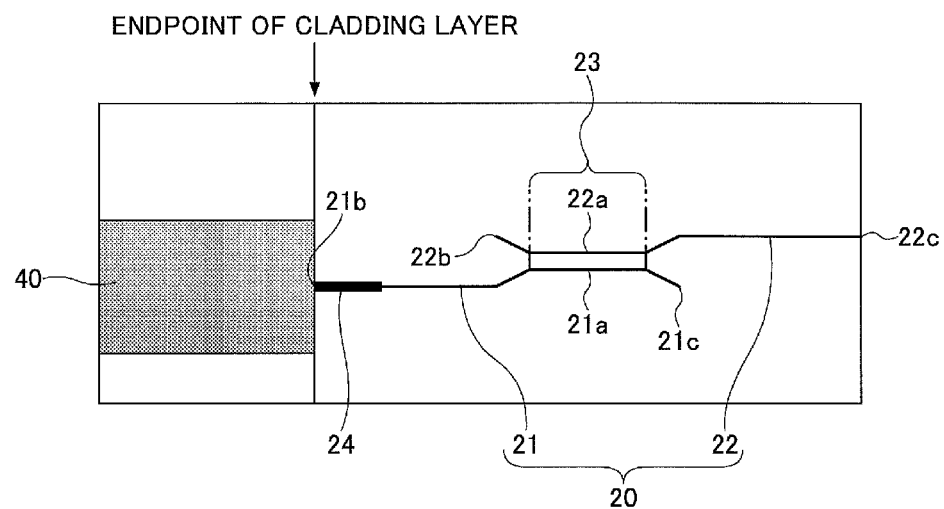
FIGS. 1A-1B are schematic views illustrating a structure of an optical semiconductor device according to a first embodiment.
Figure 1B:
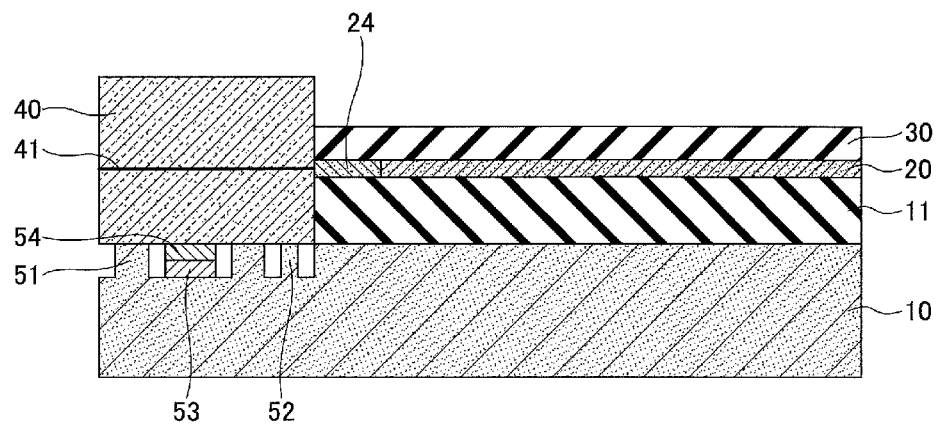

First Embodiment (Optical Semiconductor Apparatus)
An optical semiconductor device will be described according to the first embodiment. The optical semiconductor device includes a semiconductor laser and a directional coupler that functions as an optical filter whose transmittance changes depending on wavelength according to the present embodiment. The optical semiconductor device has a silicon oxide layer 11 formed on an Si (silicon) substrate 10, and an optical waveguide part 20 made of silicon formed on the silicon oxide layer 11 as illustrated in FIG. 1B according to the present embodiment. Also, a cladding layer 30 is formed of silicon oxide that covers an optical waveguide part 20. Here, FIG. 1A is a top view and FIG. 1B is a cross-sectional view of the optical semiconductor device according to the present embodiment.

According to the present embodiment, the cladding layer 30 formed above the optical waveguide part 20 constitutes an upper cladding layer, and a silicon oxide layer 11 below the optical waveguide part 20 constitutes a lower cladding layer. Also, a semiconductor laser 40, which is a semiconductor light-emitting element, is disposed above the Si substrate 10. The semiconductor laser 40 is formed of a compound semiconductor such as GaAs or the like, and includes an active layer 41. Also, the semiconductor laser 40 may be a quantum dot LD (Laser Diode), or may be a general quantum well laser. A quantum dot LD is preferable because it is less dependent on temperature. Here, in a quantum dot LD, an active layer is formed by a quantum dot active layer.

The semiconductor laser 40 is disposed on an Si base 51 that is formed by processing the surface of the Si substrate 10, an electrode (not illustrated) of the semiconductor laser 40 is connected with an electrode 53 by solder 54 on the Si substrate 10. Also, the Si substrate 10 has an alignment mark 52 formed for position adjustment performed when disposing the semiconductor laser 40.

The optical waveguide part 20 includes a first optical waveguide 21 and a second optical waveguide 22, and a coupling region 21a (a part of the first optical waveguide 21) and a coupling region 22a (a part of the second optical waveguide 22) form a directional coupler 23.

At one terminal part 21b of the first optical waveguide 21, a spot-size converter 24 is disposed having its position adjusted so that light emitted from the semiconductor laser 40 enters the spot-size converter 24. The coupling region 21a of the first optical waveguide 21 is disposed in the neighborhood of another terminal part 21c of the first optical waveguide 21, and the coupling region 22a of the second optical waveguide 22 is disposed in the neighborhood of another terminal part 22b of the second optical waveguide 22.

Therefore, laser light emitted from the semiconductor laser 40 can enter the one terminal part 21b of the first optical waveguide 21 via the spot-size converter 24. Laser light that enters the one terminal part 21b of the first optical waveguide 21 propagates from the first optical waveguide 21 to the second optical waveguide 22 at the directional coupler 23 to be emitted from the other terminal part 22c of the second optical waveguide 22.

Figure 2:
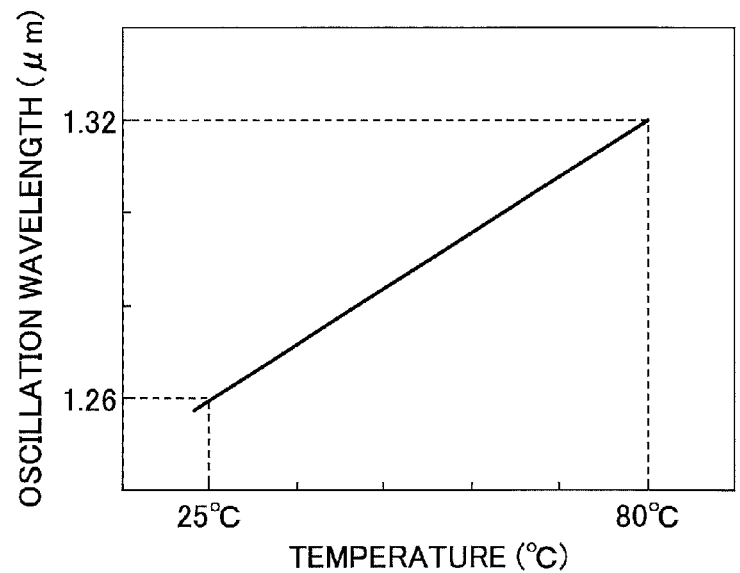
FIG. 2 is a schematic view illustrating a correlation between temperature and oscillation wavelength in a semiconductor laser.
Figure 3:
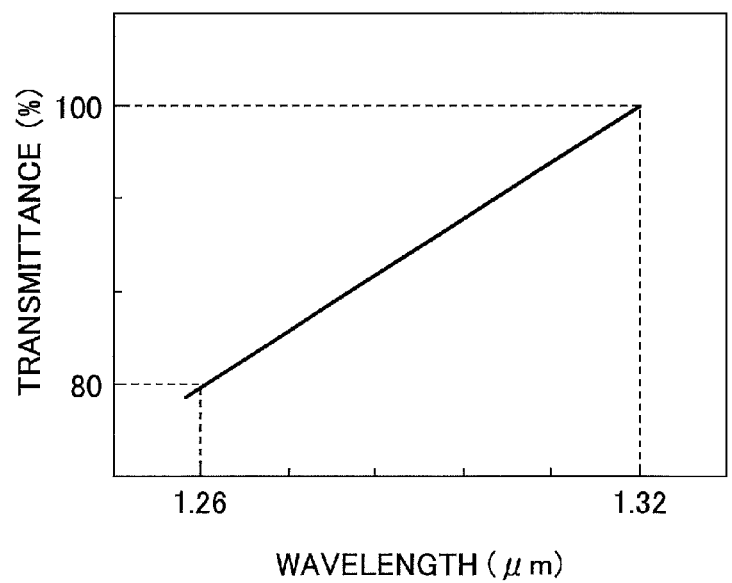
FIG. 3 is a schematic view illustrating a correlation between temperature and oscillation wavelength in a directional coupler.

Incidentally, an oscillation threshold value of the semiconductor laser 40 increases with an increase of environmental temperature, which lowers emitted laser light output and lengthens oscillation wavelength as illustrated in FIG. 2. Therefore, if a current at a certain value flows into the semiconductor laser 40, the emitted laser light output is less and the wavelength is greater at a higher temperature than at a lower temperature. The directional coupler 23 has wavelength dependency with which the amount of light propagating from the first optical waveguide 21 to the second optical waveguide 22 changes depending on the wavelength of light. Specifically, as illustrated in FIG. 3, the directional coupler 23 is formed so that its transmittance becomes higher when the wavelength of light becomes greater. Here, in the present embodiment, there are cases in which propagation efficiency of propagating light from the first optical waveguide 21 to the second optical waveguide 22 is referred to as "transmittance" for convenience's sake. Also, it is assumed that room temperature is 25° C. when describing environmental temperature. Also, there are cases in which a range of wavelengths emitted from the semiconductor laser 40 when the environmental temperature changes is referred to as an "oscillation wavelength range" of the semiconductor laser 40. Also, although it is described for the environmental temperature ranging from 25° C. (room temperature) to 80° C. in the present embodiment, it is not limited to this range, but a wider temperature range of environmental temperatures may be set depending on the usage environment. For example, the environmental temperature may be within a range of 0° C. to 80° C.

For example, consider an example where the wavelength of laser light emitted from the semiconductor laser 40 is 1.26 μm when the environmental temperature is 25° C., and 1.32 μm when the environmental temperature is 80° C. In this case, the directional coupler 23 is formed so that the transmittance of the light with the wavelength of 1.26 μm is 80% and the transmittance of the light with the wavelength of 1.32 μm is 100% as illustrated in FIG. 3. Formed in this way, if the environmental temperature is 25° C., high-output laser light is emitted from the semiconductor laser 40 with the wavelength of 1.26 μm, then attenuated at the directional coupler 23 that transmits 80% of the light, which reduces the output of the laser light emitted from the semiconductor light device. Also, if the environmental temperature is 80° C., laser light is emitted from the semiconductor laser 40 with the wavelength of 1.32 μm and with lower output than that of at 25° C., but not attenuated at the directional coupler 23 that transmits 100% of the light.

Therefore, by forming the directional coupler 23 so that its transmittance changes depending on the temperature characteristic of the semiconductor laser 40, it is possible to obtain stable output of emitted laser light that does not depend on environmental temperature. Namely, laser light emitted from the semiconductor laser 40 has lower output and greater wavelength when the environmental temperature goes higher. However, by forming the directional coupler 23 so that it has higher transmittance at greater wavelength, it is possible to obtain emitted laser light whose output is virtually stable.

This makes it possible to obtain an optical semiconductor device 40 at a low cost that has extremely small optical output fluctuation for temperature change.

(Method of Manufacturing Optical Semiconductor Device)

A method of manufacturing an optical semiconductor device 40 will be described according to the present embodiment. According to the present embodiment, an SOI (Silicon on Insulator) substrate is used in which the silicon oxide layer 11 is formed as a BOX layer on the Si substrate 10, and then a silicon layer is formed on the BOX layer. Here, the BOX layer formed in the SOI substrate has the thickness of about 3 μm and the silicon layer has the thickness of the 200 nm.

On the silicon layer in the SOI substrate, a photoresist pattern is formed at a region where the first optical waveguide 21, the second optical waveguide 22, the spot-size converter 24, and the like are formed. Specifically, photoresist is applied on the silicon layer in the SOI substrate, then a pattern to be developed is drawn by an EB drawing device, which forms the photoresist pattern at the region where the first optical waveguide 21, the second optical waveguide 22, the spot-size converter 24 and the like are formed. After that, the silicon layer is removed at regions where the photoresist pattern is not formed by dry etching such as RIE (Reactive Ion Etching) or the like.

Thus, the first optical waveguide 21, the second optical waveguide 22, the spot-size converter 24 and the like are formed on the BOX layer, namely the silicon oxide layer 11. The first optical waveguide 21 and the second optical waveguide 22 formed in this way have a width of about 340 nm and a thickness of about 200 nm, which is the same as the thickness of the silicon layer of the SOI substrate. Also, the directional coupler 23 has the length of about 500 µm, which is, being more specific, the length of the coupling region 21a of the first optical waveguide 21 and the coupling region 22a of the second optical waveguide 22 that form the directional coupler 23. Also, an interval (gap) between the coupling region 21a and the coupling region 22a, namely, the gap in the directional coupler 23, is about 400 nm.

Next, the photoresist pattern is removed, then a silicon oxide film is formed covering the first optical waveguide 21, the second optical waveguide 22, the spot-size converter 24 and the like that are formed on the silicon oxide layer 11, which becomes the cladding layer 30. The silicon oxide film to become the cladding layer 30 has a thickness of about 2 µm, which is formed by, for example, CVD (Chemical Vapor Deposition), sputtering, or the like.

Next, a region is formed on the Si substrate 10 where the semiconductor laser 40 is to be disposed, and a cladding edge surface is formed. Specifically, photoresist is applied on a surface where the cladding layer 30 is formed in the Si substrate 10, exposed by an exposure device, and developed, to form a photoresist pattern at a region except for a region where the semiconductor laser 40 is to be disposed. After that, the cladding layer 30, the silicon layer, and the silicon oxide layer 11 are removed by dry etching such as RIE or the like to form the cladding edge surface. This makes the Si substrate 10 exposed at the region where the semiconductor laser 40 is to be disposed. Then, the photoresist pattern is removed by an organic solvent or the like.

Next, photoresist is applied on the SOI substrate having a part of the surface of the Si substrate 10 exposed, then exposed by the exposure device and developed to form a photoresist pattern on a region where the Si base 51 and the alignment mark 52 are to be formed. After that, regions of the Si substrate 10 where photoresist pattern is not formed are removed to a desired depth by dry etching such as RIE or the like to form the Si base 51 and the alignment mark 52. Then, the photoresist pattern is removed by an organic solvent or the like.

Next, photoresist is applied on the SOI substrate having the Si base 51 and the alignment mark 52 formed, then exposed by the exposure device and developed to form a photoresist pattern having an opening at a region where the electrode 53 is to be formed. After that, a metal film is formed for forming an electrode 53 by vacuum deposition or the like, which is immersed in an organic solvent or the like to remove the metal film formed on the photoresist pattern by liftoff. Thus, the electrode 53 is formed, which is used for supplying electric power to the semiconductor laser 40.

Next, the semiconductor laser 40 is disposed at the region where the Si base 51 is formed. Specifically, the semiconductor laser 40 has an alignment mark (not illustrated) formed at a position corresponding to the alignment mark 52 formed on the Si substrate 10. Therefore, position adjustment can be performed between the Si substrate 10 and the semiconductor laser 40 by having the alignment mark 52 and the alignment mark (not illustrated) formed on the semiconductor laser 40 located at the same position. Having performed position adjustment between the Si substrate 10 and the semiconductor laser 40 in this way, the electrode 53 is connected with an electrode (not illustrated) of the semiconductor laser 40 by the solder 54.

Here, according to the present embodiment, the semiconductor laser 40 adopts a quantum dot laser having a p-type quantum dot active layer formed as an active layer. A quantum dot laser adopted in the semiconductor laser 40 in the present embodiment has, for example, optical output of about 16 mW at an environmental temperature of 80° C., which is about 80% (−1 dB) of optical output of about 20 mW at an environmental temperature of 25° C. Also, temperature dependency of oscillation wavelength of the quantum dot laser is about 1 nm/K, which lengthens the oscillation wavelength by about 60 nm when the environmental temperature changes from 25° C. to 80° C. Here, if transmittance of the oscillation wavelength at an environmental temperature of 25° C. can be set about 1 dB lower than transmittance of oscillation wavelength at an environmental temperature of 70° C. in the directional coupler 23 and the like, temperature dependency of laser light output can be contained within 1 dB.

(Directional Coupler)

Figure 4:
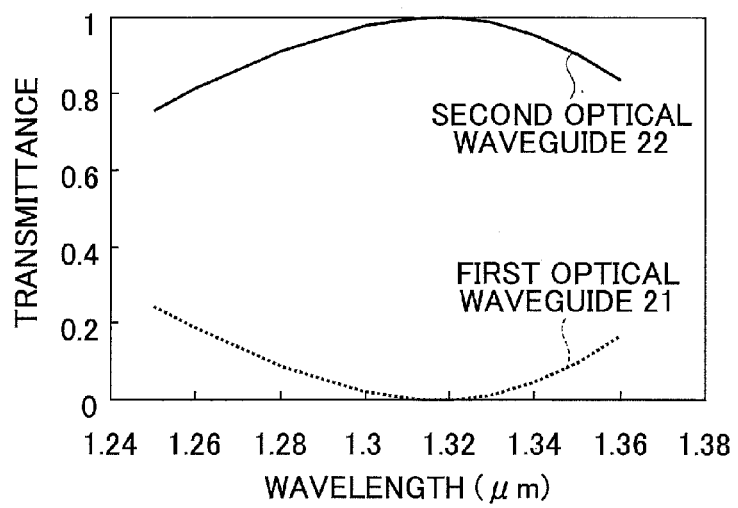
FIG. 4 is a schematic view illustrating a first correlation between wavelength and transmittance in an optical waveguide part.
Figure 5:
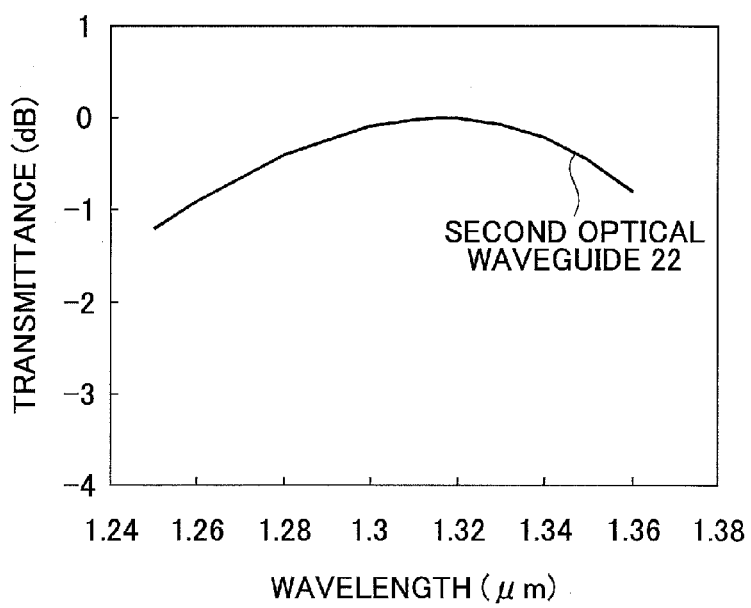
FIG. 5 is a schematic view illustrating a second correlation between wavelength and transmittance in an optical waveguide part.

Next, the directional coupler 23 will be described based on FIG. 4 and FIG. 5. FIG. 4 illustrates a ratio of the amount of light emitted from the other terminal part 21c of the first optical waveguide 21 and a ratio of the amount of light emitted from the other terminal part 22c of the second optical waveguide 22 when light enters from the one terminal part 21b of the first optical waveguide 21 in the directional coupler 23. Also, FIG. 5 illustrates a ratio of the amount of light that is emitted from the other terminal part 22c of the second optical waveguide 22 when light enters from the one terminal part 21b of the first optical waveguide 21, which is represented by the unit dB. As mentioned above, there are cases where a ratio of the amount of emitted light is referred to as "transmittance" in the present embodiment for convenience's sake.

As illustrated in FIG. 4, if light having the wavelength of 1.32 µm enters the one terminal part 21b of the first optical waveguide 21, virtually all the light entering is emitted from the other terminal part 22c of the second optical waveguide 22, hence the transmittance is 100%. However, if light having the wavelength shifted from 1.32 µm enters the one terminal part 21b of the first optical waveguide 21, light emitted from the other terminal part 22c of the second optical waveguide 22 gradually decreases, which reduces the transmittance. Specifically, when a shift from the wavelength of 1.32 µm is greater for the light entering the one terminal part 21b of the first optical waveguide 21, the transmittance is reduced more. According to the present embodiment, it is formed so that optical output of 0.8 times of entering light is obtained when light having the wavelength of 1.26 µm enters the one terminal part 21b of the first optical waveguide 21. Namely, it is formed so that the transmittance of 80% is obtained for light having the wavelength of 1.26 µm. In the present embodiment, it is preferable to provide a directional coupler 23 with which the transmittance becomes greater by more than 0.1 dB for light having the wavelength of 1.32 µm than for light having the wavelength of 1.26 µm. Also, it is more preferable if it becomes greater by more than 1 dB, and further more preferable if it becomes greater by more than 3 dB. Namely, it is preferable to have a semiconductor laser with which the transmittance becomes greater by more than 0.1 dB for light having a greater wavelength than for light having a smaller wavelength within the oscillation wavelength range. Also, it is more preferable if it becomes greater by more than 1 dB, and further more preferable if it becomes greater by more than 3 dB.

Figure 6:
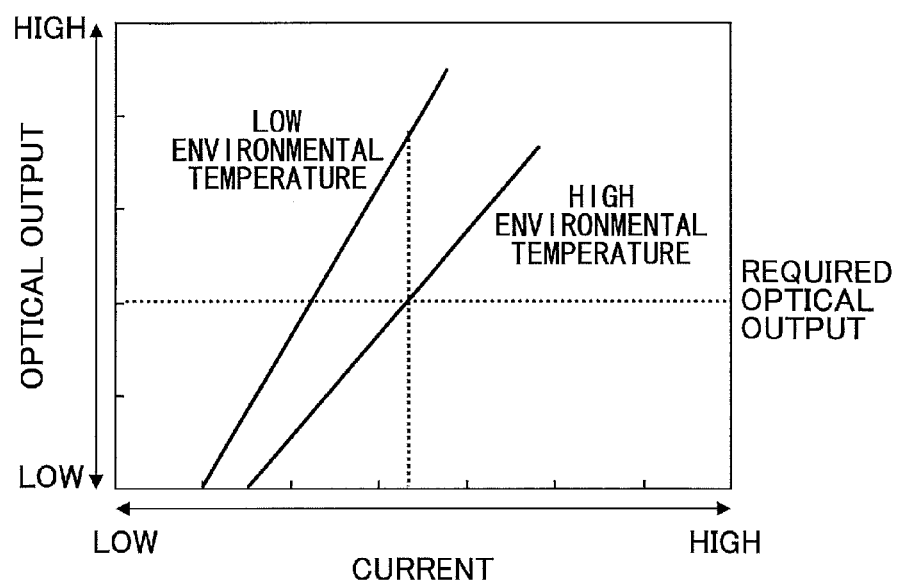
FIG. 6 is a schematic view illustrating a correlation between current and optical output in a semiconductor laser.
Figure 7:
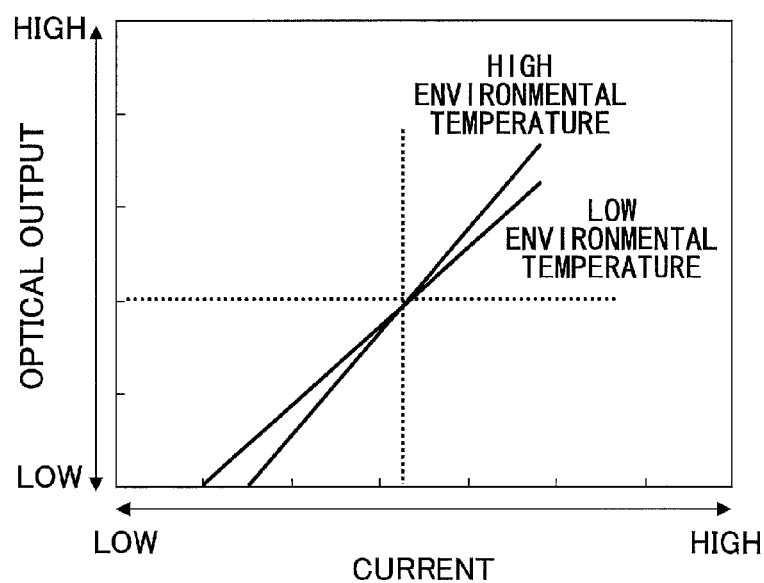
FIG. 7 is a schematic view illustrating a correlation between current and optical output in an optical semiconductor device according to the first embodiment.

The optical semiconductor device will be described in more detail according to the present embodiment based on FIG. 6 and FIG. 7. In general, the semiconductor laser 40 increases the optical output when the current value increases as illustrated in FIG. 6. Also, when the environmental temperature is higher, a threshold current value is higher than when the environmental temperature is lower, and optical output increases slower when increasing the current. Therefore, by providing a directional coupler 23 that functions as an optical filter, substantially the same optical output can be obtained when the environmental temperature changes, namely, changes to temperatures from low to high as illustrated in FIG. 7.

Here, although it has been described above for the directional coupler 23 having the length of 500 μm, change of transmittance can be made greater by extending the length of the directional coupler 23. Specifically, by extending the length of the directional coupler 23 three times to be 1500 μm, change of transmittance can be made greater, and by extending the length of the directional coupler 23 five times to be 2500 μm, change of transmittance can be further made greater. Therefore, by providing the directional coupler 23 having a great length, it is possible to sufficiently cope with a quantum well laser having a high temperature dependency used as a semiconductor laser 40.

Figure 8:
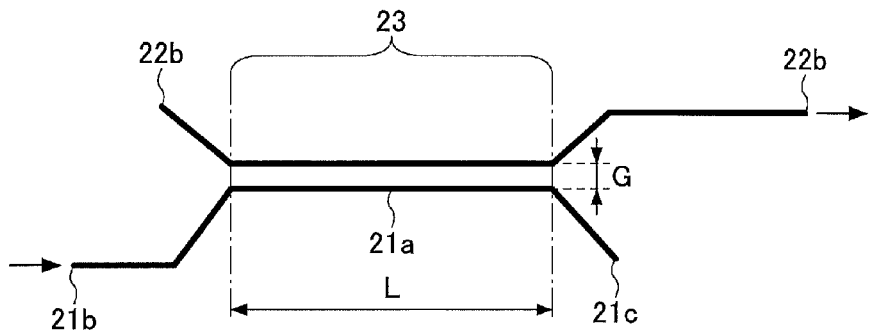
FIG. 8 is a schematic view illustrating a structure of a directional coupler.
Figure 9:
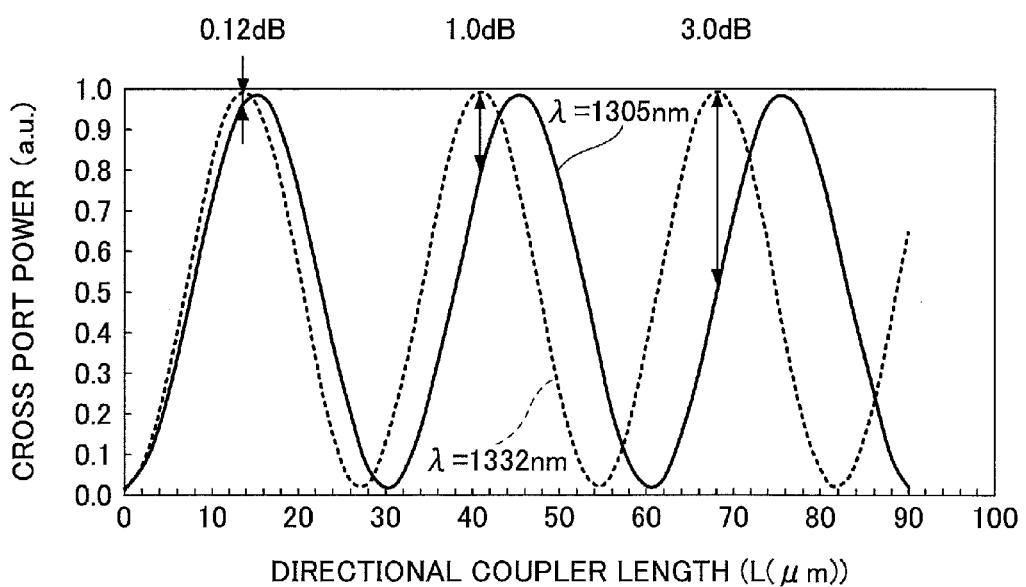
FIG. 9 is a schematic view illustrating a correlation between the length of a directional coupler and emitted optical output.

This will be described in detail based on FIG. 8 and FIG. 9. FIG. 8 illustrates a structure of the directional coupler 23 and FIG. 9 illustrates relationships between the length L of the directional coupler 23 and optical output emitted from the other terminal part 22c of the second optical waveguide 22 for the wavelength of 1305 nm and the wavelength of 1332 nm. Here, FIG. 9 is obtained by having the width set to 348 nm between the first optical waveguide 21 and the second optical waveguide 22, the interval (gap) G set to 200 nm between the coupling region 21a and the coupling region 22a in the directional coupler 23, and the thickness of the cladding layer 30 set to 2 μm.

In this case, as illustrated in FIG. 9, output difference between light with the wavelength of 1305 nm and light with the wavelength of 1332 nm is about 0.12 dB when the length L of the directional coupler 23 is about 14 μm. On the other hand, it is about 1.0 dB when the length L of the directional coupler 23 is three times greater or about 42 μm, and about 3.0 dB when the length L of the directional coupler 23 is five times greater or about 70 μm. Therefore, by extending the length of the directional coupler 23 by an odd-numbered multiple, output difference between light with the wavelength of 1305 nm and light with the wavelength of 1332 nm can be made greater, which widens a control range of transmittance.

Second Embodiment (Optical Semiconductor Device)

Next, an optical semiconductor device will be described according to the second embodiment. The optical semiconductor device has a structure that includes a semiconductor laser, a diffraction grating, and the like according to the present embodiment. Here, the diffraction grating and the like used in the present embodiment functions as an optical filter which changes transmittance depending on wavelength.

Figure 10A:
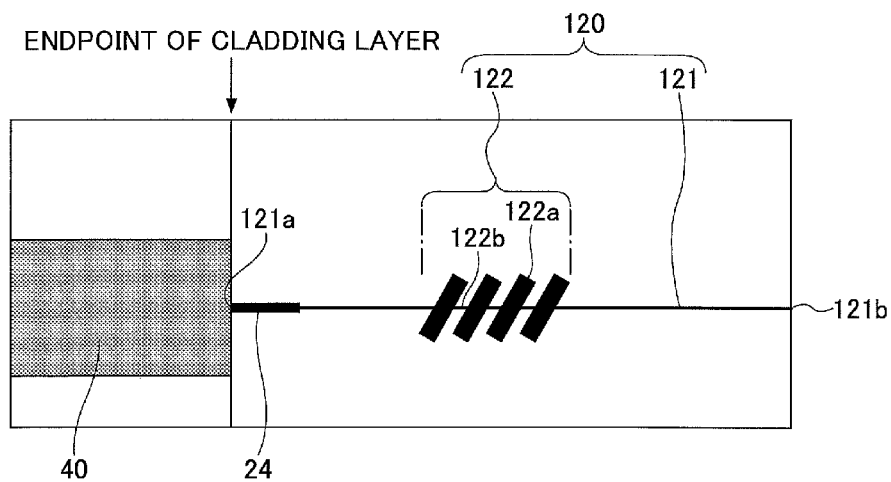
FIGS. 10A-10B are schematic views illustrating a structure of an optical semiconductor device according to a second embodiment.
Figure 10B:
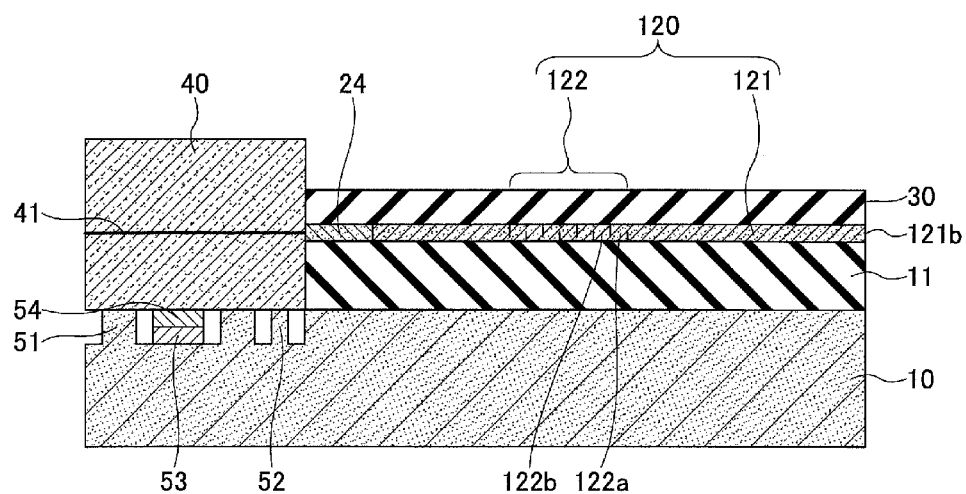

The optical semiconductor device has a silicon oxide layer 11 formed on an Si (silicon) substrate 10, and an optical waveguide part 120 made of silicon formed on the silicon oxide layer 11 as illustrated in FIG. 10B according to the present embodiment. Also, a cladding layer 30 is formed with silicon oxide that covers the optical waveguide part 120. According to the present embodiment, the cladding layer 30 formed above the optical waveguide part 120 constitutes an upper cladding layer, and a silicon oxide layer 11 below the optical waveguide part 120 constitutes a lower cladding layer. Here, FIG. 10A is a top view and FIG. 10B is a cross-sectional view of the optical semiconductor device according to the present embodiment.

Also, a semiconductor laser 40 is disposed above the Si substrate 10, similarly to the first embodiment. Specifically, the semiconductor laser 40 is disposed on an Si base 51 that is formed by processing the surface of the Si substrate 10, and an electrode (not illustrated) of the semiconductor laser 40 is connected with an electrode 53 by solder 54 on the Si substrate 10. Also, the Si substrate 10 has an alignment mark 52 formed for position adjustment performed when disposing the semiconductor laser 40.

The optical waveguide part 120 has a structure that includes a Bragg diffraction grating 122 disposed at the optical waveguide 121. In the Bragg diffraction grating 122, regions 122a having a greater width and regions 122b having a smaller width are formed alternately with predetermined intervals. By changing the length and/or interval of the regions 122a having the greater width, wavelength having the highest light transmittance can be changed. Here, in the present embodiment, it is preferable to form the Bragg diffraction grating 122 in the optical semiconductor device so that the grating has a slanted angle, rather than a right angle, with respect to the optical waveguide 121. This makes light reflected by the Bragg diffraction grating 122 hardly return to the side where the semiconductor laser 40 is disposed.

At one terminal part 121a of the optical waveguide 121, a spot-size converter 24 is disposed having its position adjusted so that light emitted from the semiconductor laser 40 enters the spot-size converter 24.

Therefore, laser light emitted from the semiconductor laser 40 can enter the one terminal part 121a of the first optical waveguide 121 via the spot-size converter 24. A part of light entering from the one terminal part 121a of the optical waveguide 121 is reflected by the Bragg diffraction grating 122, and the rest of light is transmitted the Bragg diffraction grating 122 to be emitted from another terminal part 121b of the optical waveguide 121. Here, as mentioned above, the Bragg diffraction grating 122 is formed so that reflected light hardly returns to the semiconductor light amplifier 140.

Figure 11:
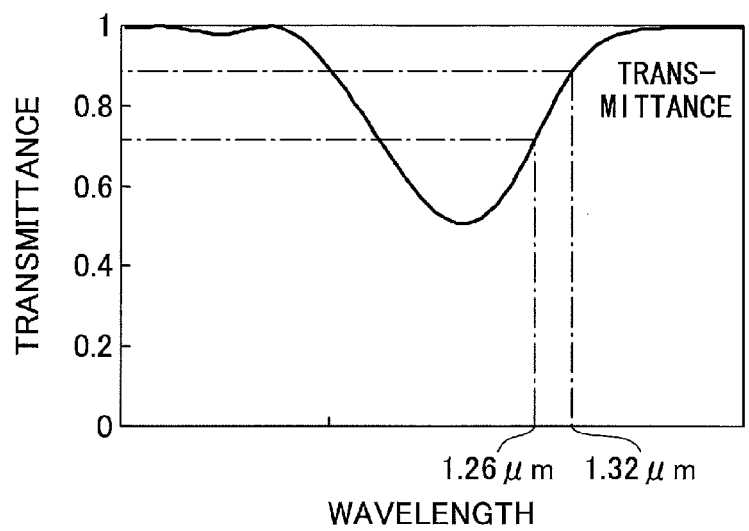
FIG. 11 is a schematic view illustrating a correlation between wavelength and transmittance in a Bragg diffraction grating.

Incidentally, an oscillation threshold value of the semiconductor laser 40 increases with an increase of environmental temperature, which lowers emitted laser light output and lengthens oscillation wavelength as described in the first embodiment. Therefore, if a current at a certain value flows into the semiconductor laser 40, emitted laser light output is less at a higher temperature than at a lower temperature. The Bragg diffraction grating 122 has a wavelength dependency as illustrated in FIG. 11 that the amount of light whereas transmits through the Bragg diffraction grating 122 changes depending on wavelength. In the present embodiment, the Bragg diffraction grating 122 is formed so that higher transmittance is obtained with a greater wavelength of light.

For example, consider an example where the wavelength of the laser light emitted from the semiconductor laser 40 is 1.26 μm when the environmental temperature is 25° C., and 1.32 μm when the environmental temperature is 80° C. In this case, the Bragg diffraction grating 122 is formed so that the transmittance of the light with the wavelength of 1.26 μm is 72% and the transmittance of the light with the wavelength of 1.32 μm is 90%. Formed in this way, if the environmental temperature is 25° C., high-output laser light is emitted from the semiconductor laser 40 with the wavelength of 1.26 μm, then attenuated at the Bragg diffraction grating 122 that transmits 72% of the light, which reduces the output of the laser light emitted from the semiconductor light device. If the environmental temperature is 80° C., laser light is emitted from the semiconductor laser 40 with the wavelength of 1.32 μm and with a lower output than that of at 25° C., and attenuated a bit at the Bragg diffraction grating 122 that transmits 90% of the light. Also, although it is described for the environmental temperature ranging from 25° C. (room temperature) to 80° C. in the present embodiment, it is not limited to this range, but a wider temperature range of the environmental temperature may be set depending on the usage environment. For example, the environmental temperature may be within a range of 0° C. to 80° C.

Therefore, by forming the Bragg diffraction grating 122 so that its transmittance changes depending on the temperature characteristic of the semiconductor laser 40, it is possible to obtain stable output of emitted laser light that does not depend on environmental temperature. Namely, laser light emitted from the semiconductor laser 40 has a lower output and a greater wavelength when the environmental temperature goes higher. However, by forming the Bragg diffraction grating 122 so that it has higher transmittance at a greater wavelength, it is possible to obtain emitted laser light whose output is virtually stable.

This makes it possible to obtain an optical semiconductor device 40 at a low cost that has extremely small optical output fluctuations for temperature changes.

Here, a ring resonator may be used instead of the Bragg diffraction grating 122 in the optical semiconductor device in the present embodiment. Also, the optical semiconductor device in the present embodiment can be manufactured with substantially the same processes as in the first embodiment. Also, contents other than the above are the same as in the first embodiment.

Third Embodiment

Figure 12:
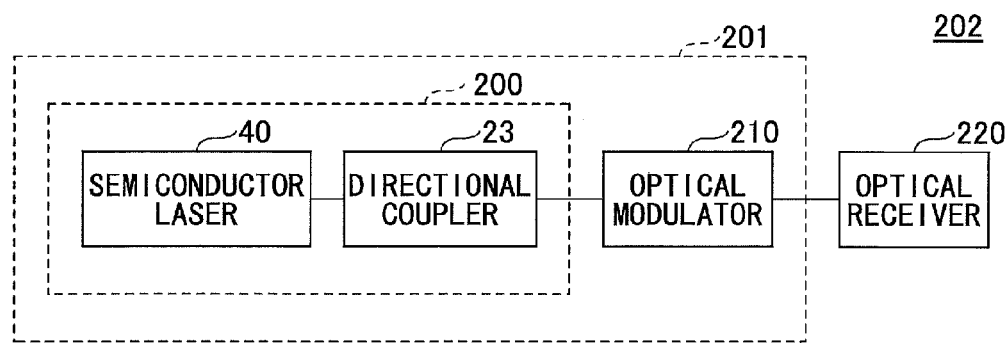
FIG. 12 is a schematic view illustrating a structure of an optical transmitter and an optical transceiver according to a third embodiment.

Next, the third embodiment will be described. The present embodiment relates to an optical transmitter and an optical transceiver that include an optical semiconductor device according to the first or second embodiment. The present embodiment will be described based on FIG. 12. FIG. 12 illustrates an example of an optical transmitter and an optical transceiver that use an optical semiconductor device according to the first embodiment as a light source 200. The optical semiconductor device according to the first embodiment to be used as the light source 200 includes a semiconductor laser 40 and a directional coupler 23. Laser light emitted from the light source 200 enters the optical modulator 210 that is optically connected with the light source 200, then is applied to laser-light modulation at the optical modulator 210 for generating a light signal. According to the present embodiment, an optical transmitter 201 is formed with the light source 200 and the optical modulator 210, and the light source 200 and optical modulator 210 are formed on the same Si substrate.

The light signal generated by modulating laser light at the optical modulator 210 enters the optical receiver 220 that is optically connected with the optical modulator 210, and the entered light signal is converted to an electric signal. According to the present embodiment, the optical transceiver 202 is formed with the light source 200, the optical modulator 210, and the optical receiver 220. The light source 200, the optical modulator 210, and the optical receiver 220 are formed on the same Si substrate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical semiconductor device comprising:
   a silicon oxide layer configured to be formed on a substrate;
   an optical waveguide part configured to be formed on the silicon oxide layer;
   a cladding layer configured to be formed covering the optical waveguide part; and
   a semiconductor laser configured to be disposed on the substrate;
   wherein laser light emitted from the semiconductor laser enters the optical waveguide part,
   wherein the optical waveguide part increases transmittance of light when the wavelength becomes greater within an oscillation wavelength range of the semiconductor laser.

2. The optical semiconductor device as claimed in claim 1:
   wherein the oscillation wavelength range of the semiconductor laser is a range of oscillation wavelength changing depending on a change of the environmental temperature,
   wherein the optical waveguide part has higher transmittance of light emitted from the semiconductor laser when the environmental temperature takes a high-temperature than when the environmental temperature takes a low-temperature.

3. The optical semiconductor device as claimed in claim 1:
   wherein the optical waveguide part includes a directional coupler formed with a part of a first optical waveguide and a part of a second optical waveguide,
   wherein laser light emitted from the semiconductor laser enters the first optical waveguide, propagates from the first optical waveguide to the second optical waveguide at the directional coupler, and is emitted from a terminal part of the second optical waveguide.

4. The optical semiconductor device as claimed in claim 1:
   wherein the optical waveguide part includes a optical waveguide and a Bragg diffraction grating formed at the optical waveguide,
   wherein laser light emitted from the semiconductor laser enters one edge surface of the optical waveguide part, passes the Bragg diffraction grating, and is emitted from another edge surface of the optical waveguide part.

5. The optical semiconductor device as claimed in claim 1:
   wherein the semiconductor laser is a quantum dot laser.

6. The optical semiconductor device as claimed in claim 1:
   wherein the semiconductor laser is a quantum well laser.

7. The optical semiconductor device as claimed in claim 1:
   wherein the optical waveguide part is formed with a material including silicon.

8. The optical semiconductor device as claimed in claim 1:
   wherein the cladding layer is formed with a material including silicon oxide.

9. The optical semiconductor device as claimed in claim 1:
   wherein the substrate is formed with a material including silicon.

10. An optical transmitter comprising:
the optical semiconductor device as claimed in claim 1; and
an optical modulator configured to be optically connected with the optical semiconductor device,
wherein the optical modulator is formed on the substrate in the optical semiconductor device.

11. An optical transceiver comprising:
the optical transmitter as claimed in claim 10; and
an optical receiver configured to receive light emitted from the optical transmitter,
wherein the optical receiver is formed on the substrate in the optical semiconductor device.

12. The optical semiconductor device as claimed in claim 1:
wherein the optical waveguide part has a higher transmittance of light within a range of wavelength longer than a wavelength obtained by oscillating the semiconductor laser at room temperature.

\* \* \* \* \*